United States Patent
Chung et al.

(10) Patent No.: US 7,446,438 B2
(45) Date of Patent: Nov. 4, 2008

(54) POWER CONTROL CIRCUIT

(75) Inventors: Shin-Hong Chung, Guangdong (CN);
Han-Che Wang, Guangdong (CN);
Kuan-Hong Hsieh, Guangdong (CN)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 84 days.

(21) Appl. No.: 11/309,505

(22) Filed: Aug. 15, 2006

(65) Prior Publication Data
US 2007/0075590 A1 Apr. 5, 2007

(30) Foreign Application Priority Data
Sep. 30, 2005 (CN) ............ 2005 1 0100077

(51) Int. Cl.
*H01H 47/00* (2006.01)
(52) U.S. Cl. .................. 307/125; 307/140; 361/190; 713/310
(58) Field of Classification Search ........... 307/140, 307/125; 713/310; 361/190
See application file for complete search history.

(56) References Cited

U.S. PATENT DOCUMENTS

| 5,790,961 | A | | 8/1998 | Ingram et al. | |
|---|---|---|---|---|---|
| 6,081,046 | A | * | 6/2000 | Jang et al. | 307/125 |
| 6,369,466 | B1 | * | 4/2002 | Murphy | 307/125 |
| 6,621,182 | B2 | * | 9/2003 | Akazawa | 307/140 |
| 6,625,739 | B1 | * | 9/2003 | Kobayashi | 713/310 |

* cited by examiner

*Primary Examiner*—Michael J Sherry
*Assistant Examiner*—Hal I Kaplan
(74) *Attorney, Agent, or Firm*—Winston Hsu

(57) ABSTRACT

A power control circuit includes an electronic switch (20) interposed between a power unit (10) and an electronic device (30), a driving circuit (40) and a mechanical switch (50). The driving circuit receives a power-on signal from the mechanical switch, and signals the electronic switch to turn on and supply power to the electronic device in accordance with the power-on signal. The electronic device controls the driving circuit to maintain the electronic switch to be on and continue the power supply to the electronic device. The electronic device further receives a power-off signal from the mechanical switch, and signals the driving circuit to turn off the electronic switch and discontinues the power supply to the electronic device.

7 Claims, 3 Drawing Sheets

POWER CONTROL CIRCUIT

DESCRIPTION

1. Technical Field

The present invention relates to a power control circuit.

2. Related Art

Usually, a mechanical switch is employed to facilitate a power on and a power off of an electronic device. The mechanic device is interposed between the electronic device and a power unit, and directly conducts the current from the power unit to the electronic device when the mechanical device is closed. However, as known to those skilled in the art, the mechanical switch consumes power and generates heat when conducting currents to the electronic device. Furthermore, the mechanical switches usually have contact bounce and produces electric arcs both when switching on and off the current flow, especially when switching on and off a large current. Contacts of the mechanical switch are easily ablated, oxidized, and worn out, and seriously affects a conduction of the mechanical switch.

Therefore, there is a need for providing a power control circuit that can solve the above-mentioned problems.

SUMMARY

A power control circuit is provided in accordance with a preferred embodiment. The power control circuit includes an electronic switch electrically coupled between a power unit and an electronic device, a driving circuit electrically coupled to the electronic switch, and a mechanical switch electrically coupled to the driving circuit. The driving circuit receives a power-on signal from the mechanical switch, and signals the electronic switch to turn on and supply power to the electronic device in accordance with the power-on signal. The electronic device controls the driving circuit to maintain the electronic switch to be on and continue the power supply to the electronic device. The electronic device further receives a power-off signal from the mechanical switch, and signals the driving circuit to turn off the electronic switch and discontinues the power supply to the electronic device.

As compared to the art using a mechanical switch to directly conduct power to an electronic device, the power control circuit provided above only utilizes the mechanical switch to switch the electronic switch on and off, and therefore consumes less power and generates less heat, and avoids the bad conduction resulted from an easily worn out mechanical switch.

Other advantages and novel features will be drawn from the following detailed description with reference to the attached drawings, in which:

DETAILED DESCRIPTION OF THE EMBODIMENTS

Figure 1:
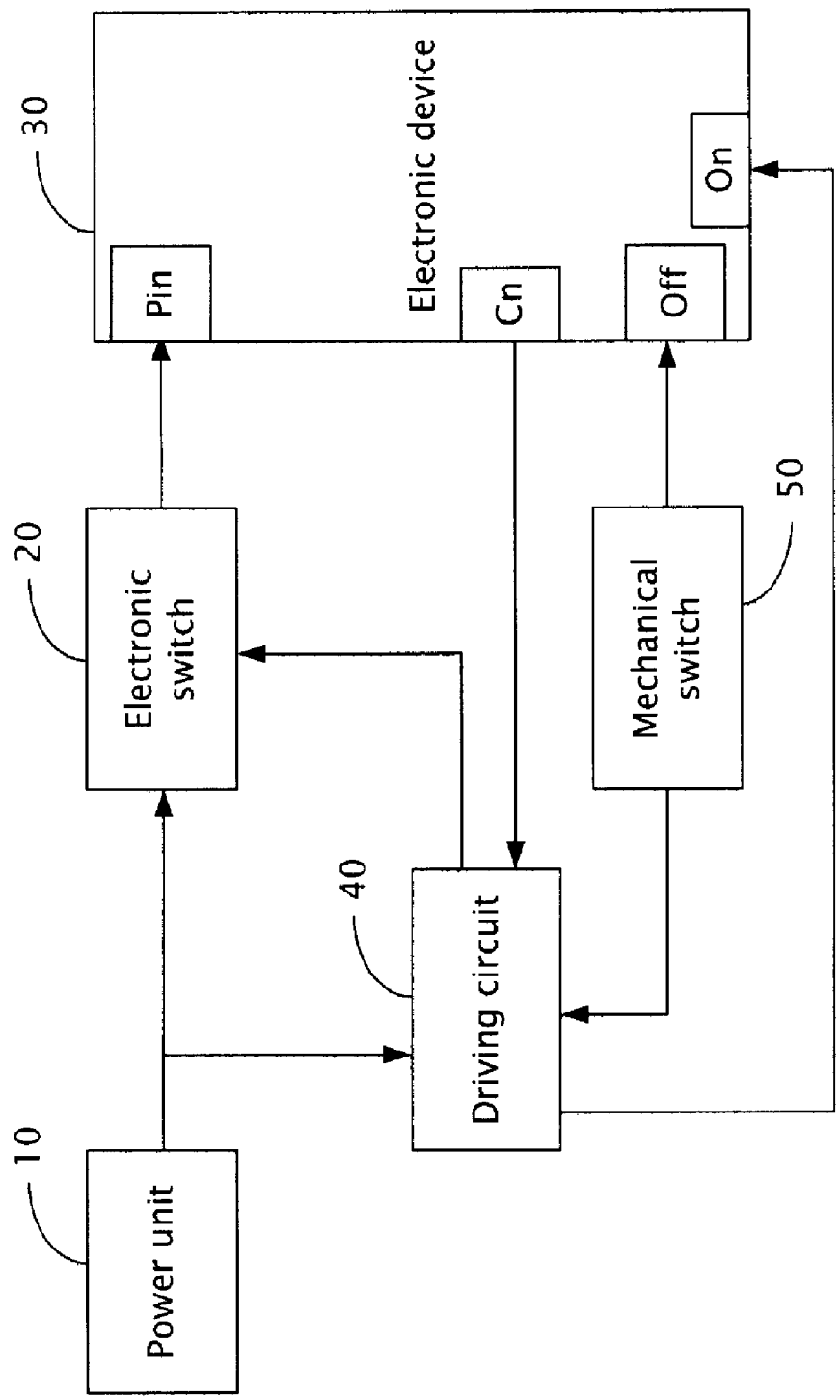
FIG. 1 depicts an exemplary block diagram of a power control circuit in accordance with a preferred embodiment of the present invention.

Referring to FIG. 1, an exemplary block diagram of a power control circuit in accordance with a preferred embodiment is shown. The power control circuit utilizes an electronic switch 20 to control a power supplied to an electronic device 30. The electronic switch 20 is interposed between the electronic device 30 and a power unit 10, and is driven to switch on and off by a driving circuit 40, thus controlling the power supplied to the electronic device 30. The driving circuit 40 receives control signals from the electronic device 30 and a mechanical switch 50, and drives the electronic switch 20 in accordance with the control signals. The mechanical switch 50 is preferably a self-returning dual-contact switch, of which a first contact of the mechanical switch 50 is connected with the driving circuit 40, and a second contact of the mechanical switch 50 is connected with the electronic device 30. A self-returning key of the self-returning dual-contact switch moves between the first and second contacts under control of an operator, and thus respectively electrically connects with the driving circuit 40 and with the electronic device 30. As a result of the movement of the self-returning key, different control signals (e.g., power-on control signals and power-off control signals) are produced and respectively transmitted to the driving circuit 40 and the electronic device 30.

The electronic device 30 includes a plurality of ports that includes a power port Pin connected with the electronic switch 20, a control port Cn connected with the driving circuit 40, a power-off port Off connected with the mechanical switch 50, and a power-on port On connected with the driving circuit 40. The power-on port On receives power-on signals from the driving circuit 40 while the power-off port Off receives power-off signals from the mechanical switch 50. The control port Cn connects with both the power-on port On and the power-off port Off, and signals the driving circuit 40 to switch the electronic switch 20 on or off in accordance with the signals received at the power-on port On or the power-off port Off.

The power-on port On and the power-off port Off may further be connected with a processor (not shown) of the electronic device 30. The power-on port On signals the processor to boot up each time a power-on signal is received, and the power-off port Off signals the processor to prepare for power off each time a power-off signal is received. For example, supposing the electronic device 30 is a computer, once the power-off port Off signals a CPU of the computer in accordance with the power-off signal, the CPU saves files and parameters and prepares for a shut down.

Figure 2:
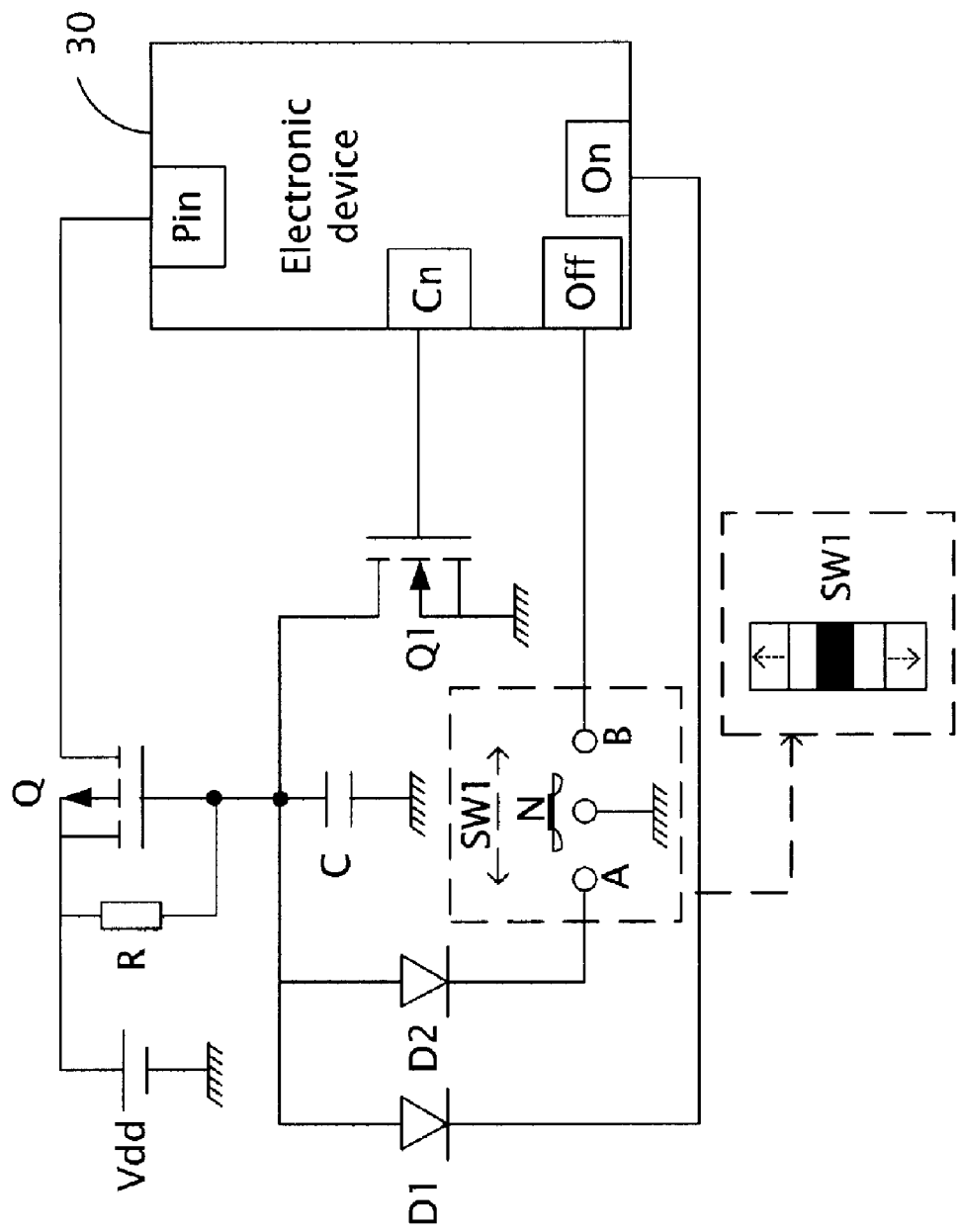
FIG. 2 depicts a circuit diagram of the power control circuit of FIG. 1.

Referring to FIG. 2, a detailed circuit diagram of FIG. 1 is shown. In FIG. 2, a P-channel MOS (hereinafter "the PMOS") Q having a gate, a drain, and a source is used as the electronic switch 20. The gate of the PMOS Q is connected with the driving circuit 40, the drain of the PMOS Q is connected with the electronic device 30, and the source of the PMOS Q is connected with a DC (direct-current) power unit Vdd. A resistance component (e.g., a resistor R), two diodes D1 and D2 and an N-channel MOS (hereinafter "the NMOS") Q1 constitute the driving circuit 40. The resistor R is interposed between the source and the gate of the PMOS Q, and used to produce a voltage drop Vsg between the source and the gate of the PMOS Q when a current flows through the resistor R, thus turning on the PMOS Q. Anodes of the diodes D1 and D2 are connected with the gate of the PMOS Q, and cathodes of the diodes D1 and D2 are respectively connected with the power-on port On and the mechanical switch 50. The NMOS Q1 has a gate, a source and a drain respectively connected with the control port Cn, the ground, and the gate of the PMOS Q.

In FIG. 2, the mechanical switch 50 is a self-returning dual-contact switch SW1. A common contact, a left contact indicated by a symbol A, and a right contact indicated by a symbol B of the self-returning dual-contact switch SW1 are respectively connected to ground, the diode D2, and the power-off port Off. A self-returning key N of the self-returning dual-contact switch SW1 remains at an idle position when no external force is applied thereon, and moves between the contacts A and B by control of an operator. When the self-returning key N reaches the contact A, the self-returning key N connects the diode D2 to ground and the followings sequentially take place. 1st, a current supplied by the DC power unit Vdd flows through the resistor R, the diode D2, and the self-returning dual-contact switch SW1. 2nd, the voltage drop Vsg is produced and turns on the PMOS Q. 3rd, power is then supplied from the DC power unit Vdd to the electronic device 30. 4th, the power-on port On receives a low-level power-on signal from the driving circuit 40. 5th, the electronic device 30 boots up and controls the control port Cn at a high level potential in accordance with the low-level power-on signal. 6th, The NMOS Q1 turns on accordingly and allows a current supplied by the DC power unit Vdd to flow though the resistor R, and the NMOS Q1 to the ground. Finally, the voltage drop Vsg is maintained, along with the power supplied to the electronic device 30.

When the self-returning key N reaches the contact B, the self-returning key N connects the power-off port Off to ground and the followings sequentially take place. 1st, the power-0ff port Off receives a low-level power-off signal from the ground. 2nd, the electronic device 30 prepares for the power off and controls the control port Cn at a low level potential in accordance with the low-level power-off signal. 3rd, the NMOS Q1 accordingly turns off and the current flowing through the resistor R is stopped. 4th, the PMOS Q turns off and the power supplied to the electronic device 30 is discontinued.

Figure 3:
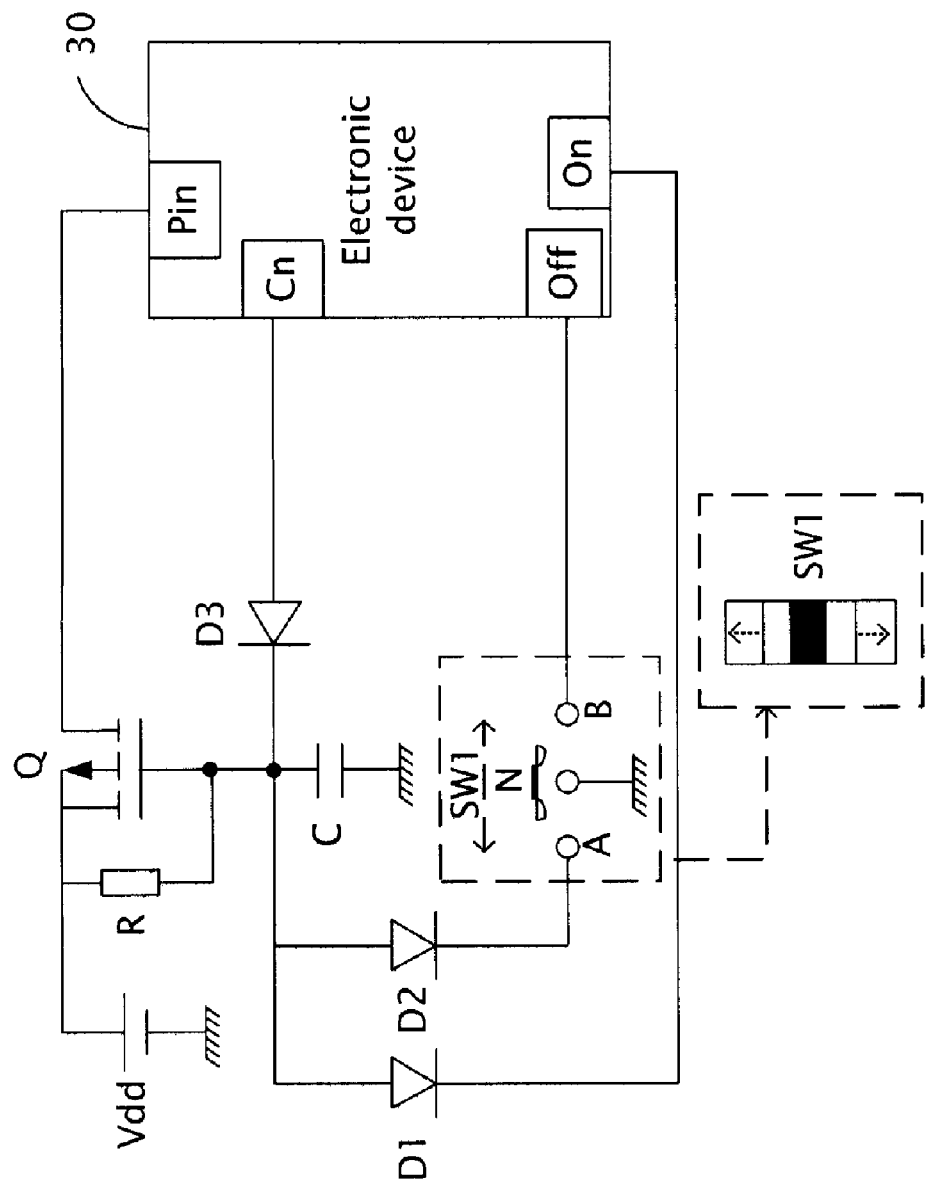
FIG. 3 depicts another circuit diagram of the power control circuit of FIG. 1.

FIG. 3 shows another detailed circuit diagram of FIG. 1. FIG. 3 is similar to FIG. 2 except that FIG. 3 employs a diode D3 instead of the NMOS Q1 in FIG. 2. A cathode of the diode D3 is connected with the gate of the PMOS Q and an anode of the diode D3 is connected with the control port Cn. The electronic device 30 controls the control port Cn at a high level potential upon receiving the low-level power-on signal from the driving circuit 40, thereupon maintains the voltage drop Vsg and the power supplied to the electronic device 30. The electronic device 30 further controls the control port Cn at a low level potential upon receiving the low-level power-off signal from the mechanical switch 50, thereupon discontinues the power supplied to the electronic device 30.

In both FIGS. 2 and 3, the dual-contact self-returning switch SW1 may be substituted with a multi-contact self-returning switch, such that a first contact of the multi-contact self-returning switch is connected with the driving circuit 40 and transmits a low-level power-on signal to the driving circuit 40, and a second contact of the multi-contact self-returning switch is connected with the electronic device 30 and transmits a low-level power-off signal to the electronic device 30.

As described above, by utilizing the electronic switch 20 to conduct power to the electronic device 30, and utilizing the electronic device 30 to keep the electronic switch 20 to be on and continuously maintain power supply to the electronic device 30, the mechanical switch 50 only needs to switch the electronic switch 20 on and off. Hence, as compared to the art using a mechanical switch to directly conduct power to an electronic device, the power control circuit provided above consumes less power and generates less heat, and avoids bad conductions resulting from an easily worn out mechanical switch.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A power control circuit, comprising a power unit, an electronic device, a driving circuit, an electronic switch comprising a P-channel MOSFET having a gate, a source and a drain electrically connecting with the driving circuit, the power unit and the electronic device respectively, and a mechanical switch having a first contact and a second contact electrically connecting with the driving circuit and the electronic device respectively, the mechanical switch further comprising a self-returning key which is capable of moving between the first contact and the second contact by controlling of an external force, when the self-returning key reaches the first contact, the mechanical switch producing a power-on signal when the self-returning key reaches the first contact and producing a power-off signal when the self-returning key reaches the second contact, wherein:

the driving circuit comprises a first diode having a cathode and an anode, the cathode connecting with the gate of the P-channel MOSFET and the anode connecting with a control port of the electronic device;

the driving circuit receives the power-on signal from the mechanical switch and signals the electronic switch to turn on and allow the power unit to supply power to the electronic device;

the electronic device controls the driving circuit through the first diode connected between the gate of the P-channel MOSFET and the control port of the electronic device to maintain the electronic switch to be on and allow the power unit to continue supply the electronic device with power; and the electronic device receives the power-off signal from the mechanical switch, and the electronic device signals the driving circuit through the first diode connected between the gate of the P-channel MOSFET and the control port of the electronic device to turn off and disconnect the power unit from the electronic device.

2. The power control circuit as claimed in claim 1, wherein the driving circuit further comprises a resistance component electrically coupled between the source and the gate of the P-channel MOSFET and a N-channel MOSFET having a gate, a source and a drain, the gate of the N-channel MOSFET connecting with the electronic device, the source of the N-channel MOSFET being grounded and the drain of the N-channel MOSFET connecting with the gate of the P-channel MOSFET.

3. The power control circuit as claimed in claim 2, wherein the first contact of the mechanical switch connects with a cathode of a second diode, and an anode of the second diode connects with the drain of the N-channel MOSFET.

4. The power control circuit as claimed in claim 3, wherein the driving circuit further comprises a resistance component electrically coupled between the source and the gate of the P-channel MOSFET and a third diode having a cathode and an anode, the cathode connecting with the gate and the anode connecting with one input port of the electronic device.

5. The power control circuit as claimed in claim 1, wherein the electronic device is configured for receiving the power-on signal via the driving circuit and booting up in accordance with the power-on signal.

6. The power control circuit as claimed in claim 1, wherein the electronic device is configured for receiving the power-off signal and preparing for a shut down in accordance with the power-off signal.

7. The power control circuit as claimed in claim 4, wherein the second contact is connecting to an input port of the electronic device.

* * * * *